US012774762B2

(12) United States Patent

Ehrne et al.

(10) Patent No.: US 12,774,762 B2
(45) Date of Patent: Oct. 27, 2026

(54) GAS INLET VALVE FOR VACUUM PROCESS CHAMBERS

(71) Applicant: VAT Holding AG, Haag (CH)

(72) Inventors: Florian Ehrne, Frümsen (CH); Martin Netzer, Bludenz (AT); Hanspeter Frehner, Sevelen (CH)

(73) Assignee: VAT Holding AG, Haag (CH)

( * ) Notice: Subject to any disclaimer, the term of this patent is extended or adjusted under 35 U.S.C. 154(b) by 0 days.

(21) Appl. No.: 17/776,437

(22) PCT Filed: Nov. 18, 2020

(86) PCT No.: PCT/EP2020/082566
§ 371 (c)(1),
(2) Date: May 12, 2022

(87) PCT Pub. No.: WO2021/099405
PCT Pub. Date: May 27, 2021

(65) Prior Publication Data

US 2022/0403953 A1 Dec. 22, 2022

(30) Foreign Application Priority Data

Nov. 19, 2019 (DE) ..................... 10 2019 008 017.3

(51) Int. Cl.
*F16K 41/12* (2006.01)
*F16K 37/00* (2006.01)
(Continued)

(52) U.S. Cl.
CPC .............. *F16K 41/12* (2013.01); *F16K 51/02* (2013.01); *H10P 72/0402* (2026.01); *F16K 37/0041* (2013.01)

(58) Field of Classification Search
CPC ...... F16K 41/12; F16K 51/02; F16K 37/0041; H01L 21/67017
See application file for complete search history.

(56) References Cited

U.S. PATENT DOCUMENTS 2,646,077 A 7/1953 Whitney
3,652,187 A * 3/1972 Loeffler .............. F04B 43/0736 417/393
(Continued)

FOREIGN PATENT DOCUMENTS

CN 1865741 A 11/2006
CN 101248402 A 8/2008
(Continued)

OTHER PUBLICATIONS

"Notification of Transmittal of the International Search Report and the Written Opinion of the International Searching Authority, or the Declaration," International Filing Date: Nov. 18, 2020, International Application No. PCT/EP2020/082566, Applicant: VAT Holding AG, Date of Mailing: Feb. 9, 2021, pp. 1-10.

*Primary Examiner* — Angelisa L. Hicks
(74) *Attorney, Agent, or Firm* — Muncy, Geissler, Olds & Lowe, P.C.

(57) ABSTRACT

The invention relates to a gas inlet valve for the controlled inlet of a process gas into a vacuum process chamber, wherein the gas inlet valve comprises: a gas flow unit with a gas inlet, a gas outlet and an inner volume which has free access to the gas inlet and to the gas outlet, wherein the gas flow unit has a sealing surface in the inner volume, an adjusting device with an adjusting unit, wherein the adjusting unit projects into the inner volume and is adjustably mounted outside the gas flow unit in the adjusting device, wherein the adjusting unit has a plate which is arranged inside the inner volume, wherein the plate can be brought into a closed position by means of the adjusting device, in which the plate rests on the sealing surface and thus prevents a gas flow, and wherein the plate can be brought by means of the adjusting device into an open position in which the plate is spaced from the sealing surface and thus allows a gas flow, two flexible sealing elements, which are fixed in each
(Continued)

case to the gas flow unit and to the adjusting unit and thereby seal the inner volume, and a position determination unit which is arranged on or in the adjusting device and is adapted to determine a position of a part of the adjusting unit which has a fixed local relation to the plate.

13 Claims, 6 Drawing Sheets

(51) Int. Cl.
*F16K 51/02* (2006.01)
*H10P 72/00* (2026.01)

(56) References Cited

U.S. PATENT DOCUMENTS 3,770,195 A 11/1973 Franz
4,824,545 A 4/1989 Arnold et al.
5,186,209 A * 2/1993 McManigal ....... G05D 16/0672 137/505.11
6,041,814 A 3/2000 Kouketsu et al.
6,079,434 A * 6/2000 Reid .................. G05D 16/0655 137/484.8
7,070,160 B2 7/2006 Ijichi et al.
8,794,588 B1 * 8/2014 Jorgensen ........... F16K 31/1264 251/282
2004/0244850 A1 12/2004 Browne et al.
2005/0285064 A1 12/2005 Yoshino et al.
2010/0090151 A1 4/2010 Tanikawa et al.
2013/0292216 A1 11/2013 Bradford et al.

FOREIGN PATENT DOCUMENTS

| | | | |
|---|---|---|---|
| CN | 201416643 | Y | 3/2010 |
| CN | 107420468 | A | 12/2017 |
| DE | 2314842 | A1 | 10/1973 |
| DE | 3731444 | A1 | 3/1989 |
| EP | 3290761 | A1 | 3/2018 |
| JP | H10-252942 | A | 9/1998 |
| JP | 2007-064333 | A | 3/2007 |
| JP | 2007-299344 | A | 11/2007 |
| WO | 2007/023970 | A1 | 3/2007 |
| WO | 2012/118071 | A1 | 7/2014 |

* cited by examiner

GAS INLET VALVE FOR VACUUM PROCESS CHAMBERS

CROSS-REFERENCE TO RELATED APPLICATIONS

The present application is the National Stage of International Application No. PCT/EP2020/082566, filed on Nov. 18, 2020, which claims priority from German patent application No. 10 2019 008 017.3 filed on Nov. 19, 2019, the disclosure of both of which should be understood to be incorporated into this specification.

FIELD OF THE INVENTION

The present invention relates to a gas inlet valve for admitting a process gas into a vacuum process chamber.

BACKGROUND OF THE INVENTION

Such vacuum process chambers are used for Integrated Circuit (IC), semiconductor, flat panel or substrate manufacturing, wherein the vacuum chambers are flooded with a process gas at least for part of the process steps after evacuation. The production must take place in a protected atmosphere and, if possible, without the presence of contaminating particles. The evacuation is carried out with a vacuum valve, which connects the vacuum process chamber to a vacuum pump and differs in its design and technical requirements from a gas inlet valve.

Furthermore, such vacuum chambers have at least one or two vacuum chamber openings through which the elements to be processed can be guided into and/or out of the vacuum chamber. For example, in a manufacturing plant for semiconductor wafers or liquid crystal substrates, the highly sensitive semiconductor or liquid crystal elements pass sequentially through several vacuum process chambers, in which the elements are processed by means of one processing device each.

The element can, for example, be placed by means of a robot on extended support pins of a lifting system and by lowering the support pins it can be placed on a carrier, e.g. a potential plate (chuck). The robot arm, which typically carries the element, is then moved out of the chamber. The pins can be lowered after the element has been deposited and are then separated from the element, i.e. there is no contact between the pins and the element. After removing the robot arm and closing the chamber, the chamber is usually evacuated and then filled with a process gas, whereupon the processing of the element can start.

Gas inlet valves are especially designed for defined control or regulation of the gas flow and are located, for example, within a pipe system between a vacuum process chamber (or a transfer chamber) and a gas source, the atmosphere or another vacuum process chamber. The opening cross section of such gas inlet valves is usually smaller than that of a vacuum valve.

Since gas inlet valves, depending on the field of application, are used not only to fully open and close an opening, but also to control or regulate a flow rate by continuously adjusting the opening cross-section between an open position and a gas-tight closed position, they are also called regulating valves.

When admitting the process gas into the chamber, low fluidic effects within the chamber as well as fast and precisely controllable filling are of great importance.

OBJECT OF THE INVENTION

Therefore, it is an object of the invention to provide an improved gas inlet valve for a vacuum process chamber. In particular, the gas inlet valve according to the invention enables a faster and more precisely controllable flooding of an evacuated vacuum process chamber with a process gas.

SUMMARY OF THE INVENTION

The present invention relates to a gas inlet valve for the controlled inlet of a process gas into a vacuum process chamber, wherein the gas inlet valve comprises: a gas flow unit with a gas inlet, a gas outlet and an inner volume which has free access to the gas inlet and the gas outlet, wherein the gas flow unit has a sealing surface in the inner volume, an adjusting device with an adjusting unit, wherein the adjusting unit projects into the inner volume and is adjustably mounted outside the gas flow unit in the adjusting device, wherein the adjusting unit has a plate which is arranged inside the inner volume, wherein the plate can be brought into a closed position by means of the adjusting device, in which the plate rests on the sealing surface and thus prevents a gas flow, and wherein the plate can be brought by means of the adjusting device into an open position in which the plate is spaced from the sealing surface and thus allows a gas flow, a first flexible sealing element attached to the gas flow unit and to the adjusting unit and seals the adjusting unit against the inner volume, and a position determination unit arranged on or in the adjusting unit and is adapted to determine a position of a part of the displacement unit having a fixed local relation to the plate.

In one embodiment, the gas inlet valve may include a second flexible sealing element, wherein the first and second flexible sealing elements embody two flexible sealing elements attached to the gas flow unit and the adjusting unit, respectively, thereby sealing the inner volume.

Thus, the present invention also relates to a gas inlet valve for controlled inlet of a process gas into a vacuum process chamber, wherein the gas inlet valve comprises: a gas flow unit with a gas inlet, a gas outlet and an inner volume having free access to the gas inlet and the gas outlet, wherein the gas flow unit has a sealing surface in the inner volume, an adjusting device with an adjusting unit, wherein the adjusting unit projects into the inner volume and is adjustably mounted outside the gas flow unit in the adjusting device, wherein the adjusting unit has a plate arranged inside the inner volume, wherein the plate is movable into a closed position by means of the adjusting device, in which the plate rests on the sealing surface and thus prevents a gas flow, and wherein the plate can be brought by means of the adjusting device into an open position in which the plate is spaced from the sealing surface and thus allows a gas flow, two flexible sealing elements attached to the gas passage unit and to the adjusting unit, respectively, and sealing the inner volume therewith, and a position determination unit arranged on or in the adjusting unit and adapted to determine a position of a part of the adjusting unit having a fixed local relation to the plate.

According to one embodiment, the first and/or second flexible sealing element may be attached to the plate and the gas flow unit.

One of the sealing elements or both sealing elements are designed in one embodiment as a membrane, in particular as a metal membrane. In particular, at least one of the sealing elements as well as the side of the plate opposite the respective sealing element have a similarly large, in particular exactly the same pressure application surface, whereby at least essentially a pressure force cancellation is achieved, which makes a movement of the plate independent of the prevailing pressure. This allows the valve to be adjusted more quickly.

In the closed position, the plate is pressed against the sealing surface in particular by a pretension, wherein the pretension emanates at least partially from at least one of the sealing elements and/or at least partially from a pretensioning device arranged outside the inner volume. In particular, therefore, at least one of the sealing elements has a spring hardness and can counteract the force of the prevailing pressure by means of a pretension. If the pretension is at least partially emanating from the pretensioning device, the pretensioning device is enclosed by the adjusting device. In addition, the above-mentioned application surfaces and/or the spring stiffness(es) of the spring element(s) can be adapted to each other in such a way that a pretension bias is created, which has a beneficial effect on the reaction time of the valve (e.g. if only opening or only closing must be able to take place quickly).

The plate and/or the sealing surface may have a sealing ring which is compressed in the closed position. Compression is due to the pretension and ensures that the gas inlet is separated gas-tight from the gas outlet.

The two sealing elements can be pretensioned against each other, so that if the adjusting unit is adjusted, no or only a comparatively low resistance force is generated by the sealing elements.

The sealing surface, the plate and the sealing elements have in particular a circular cross-section, wherein the inner volume is cylindrical at least in sections, and wherein the sealing surface is formed by a shoulder in the inner volume.

The cylindrical shape of the inner volume is formed in particular by the gas flow unit as a jacket surface and the sealing elements as base surfaces, wherein the gas inlet and gas outlet gain free access to the inner volume via the jacket surface. This means that gas inlet and gas outlet each pierce the outer surface.

The adjusting device can be operated electrically or pneumatically.

In particular, the plate divides the inner volume in the closed position into a first and a second partial inner volume, wherein the gas inlet has free access to the first partial volume and the gas outlet has free access to the second partial volume.

The gas outlet has especially free access to a vacuum process chamber and the gas inlet has especially free access to a gas source.

BRIEF DESCRIPTION OF THE DRAWINGS

Further advantages of the present invention are evident from the detailed description and drawings.

DETAILED DESCRIPTION OF THE DRAWINGS

Figure 1:
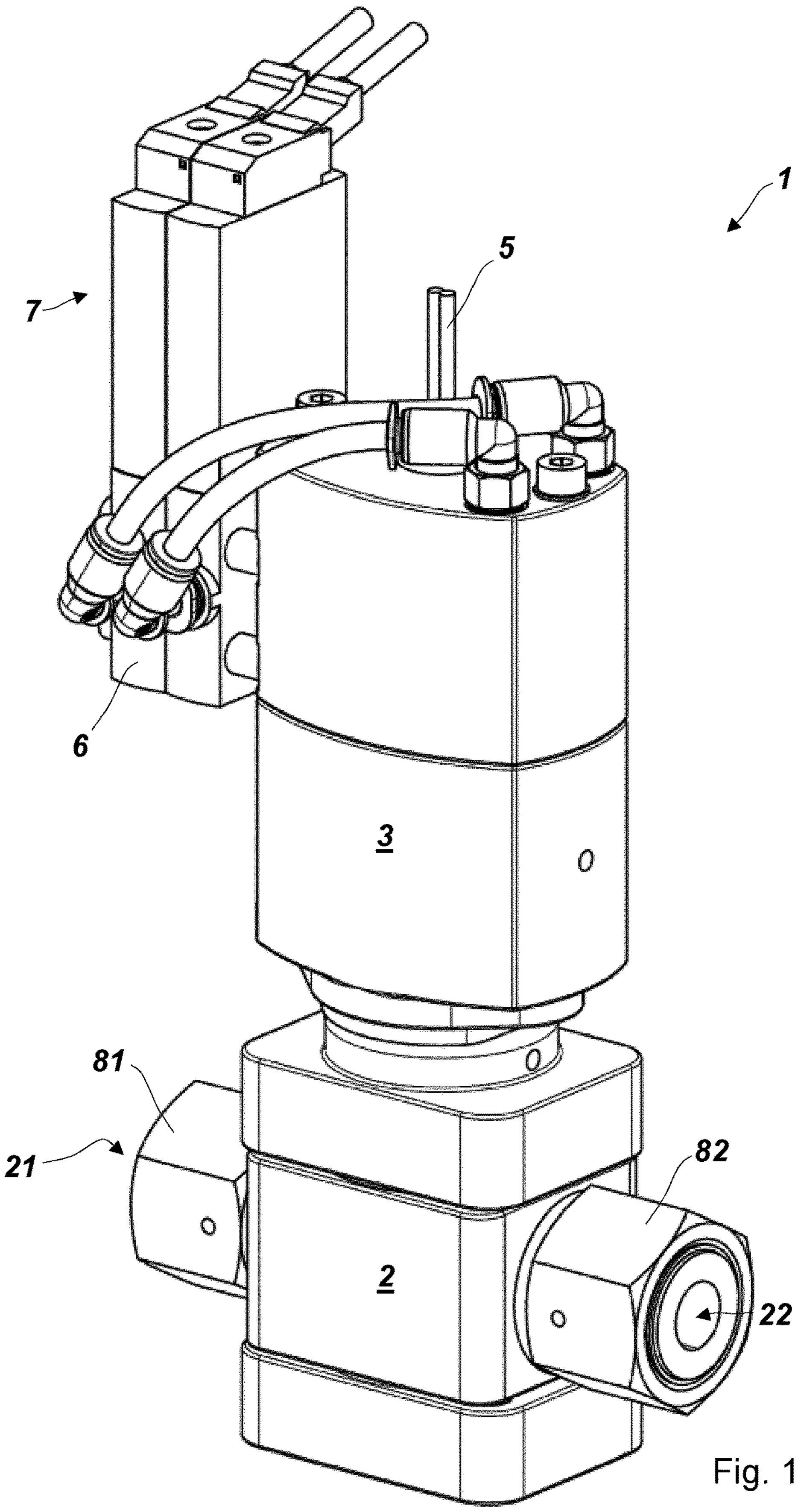
FIG. 1 is a perspective view of an embodiment of a gas inlet valve.
Figure 2:
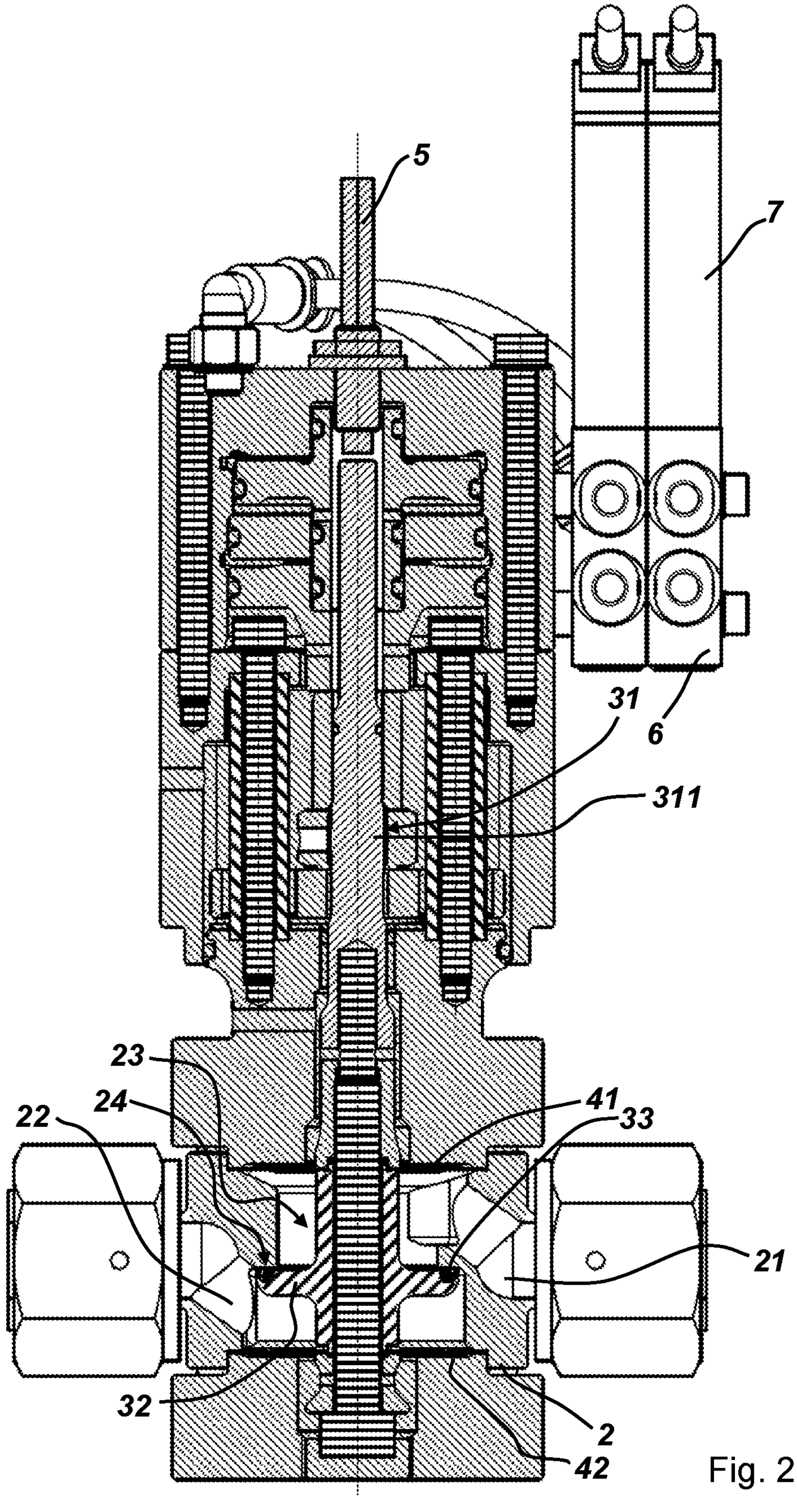
FIGS. 2 and 3 show the gas inlet valve from FIG. 1 in two different sectional views.
Figure 3:
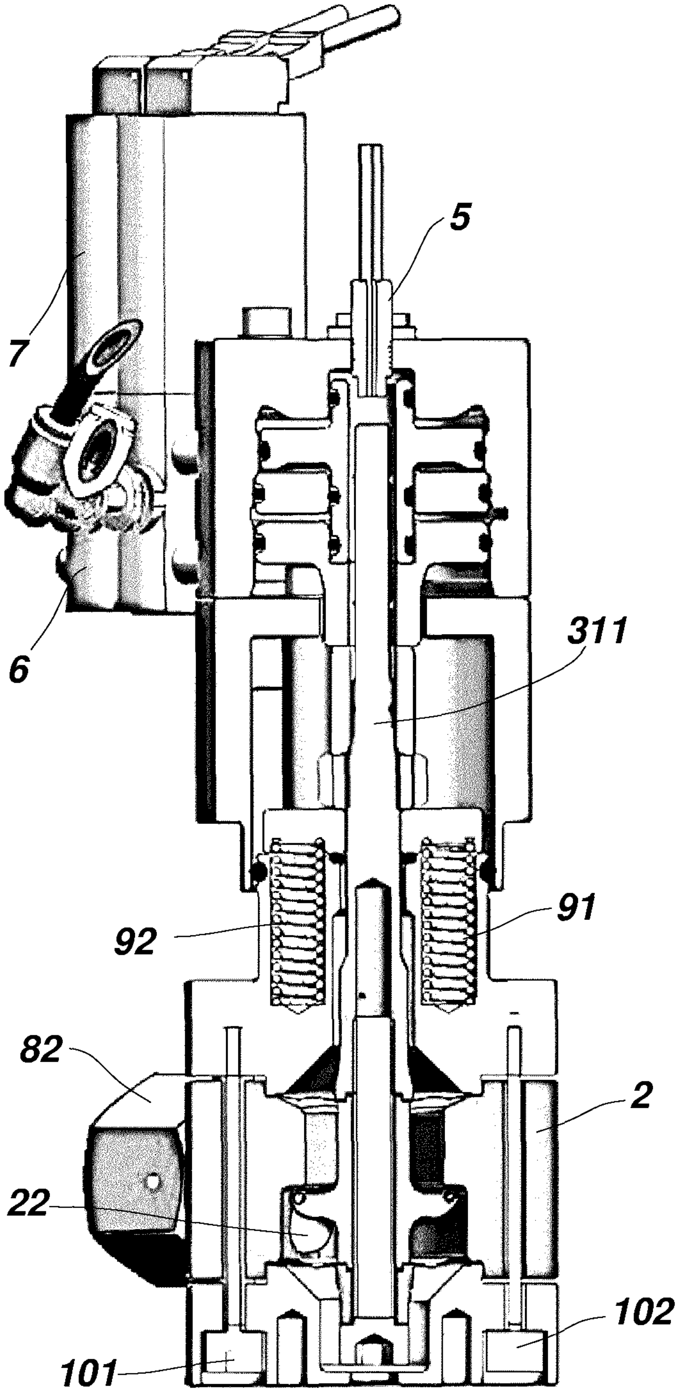

FIGS. 1 to 3 show an exemplary embodiment of a gas inlet valve 1 with a gas flow unit 2, which has a gas inlet 21, a gas outlet 22 and an inner volume 23, wherein the inner volume 23 has free access to the gas inlet 21 and to the gas outlet 22, and wherein the gas flow unit has a sealing surface 24 in the inner volume.

The adjusting device 3 comprises an adjusting unit 31 and a plate 32, wherein the adjusting unit 31 projects into the inner volume 23 and is adjustably mounted outside the gas flow unit 2 in the adjusting device 3, wherein the plate is arranged inside the inner volume 23 and is movable by means of the adjusting device 3 into a closed position in which the plate 32 rests on the sealing surface 24 and thus prevents a gas flow. By means of the adjusting device 3, the plate can furthermore be brought into an open position in which the plate 32 is spaced from the sealing surface 24 and thus allows gas to flow.

The gas inlet valve 1 also has two flexible sealing elements 41 and 42, which are designed as membranes in the example shown. The sealing elements are each attached to the gas flow unit 2 and to the adjusting unit 31, thus sealing the inner volume 23.

A position determination unit 5 is located at the adjusting device 3 and is set up to determine a position of the upper end of the adjusting unit 31. In the example shown, the adjusting unit 31 has several elements that are fixedly connected to each other so that the location of the measurement (upper end of the adjusting unit 31) has a fixed local relation to the plate. Thus, the position of the plate can be determined at any time and without interruption. In other words, the plate 32 is fixedly connected to the adjusting unit 31, whereby the determination of a position of the adjusting unit 31 simultaneously corresponds to a position determination for the plate 32. By determining a plate position, in particular continuously or continuously, an active control (and/or regulation) of the valve and thus of the gas flow can be carried out. Advantageously, the downstream (after the gas outlet) determination of an actual gas flow (as controlled variable) depending on a current valve control can be omitted.

FIG. 1 shows the gas inlet valve 1 in perspective from the outside, wherein in the example shown, a pneumatic device 6 and a control unit 7 are also provided, which can be used to control the adjusting device 3. In other embodiments, the adjusting device 3 can be operated by electric motors.

Connections 81 and 82 are provided in each case for gas inlet 21 and gas outlet 22. The line to the gas source and the line to the vacuum process chamber can be connected via these connections.

FIG. 3 shows a sectional view of the gas inlet valve 1 as in FIG. 2, but at a different angle, so that spiral springs 91 and 92, which are installed in the adjusting device 3, are visible. The plate 32 is pressed against the sealing surface 24 in a closed position by a pretension in the springs. A sealing ring 33 provides a gas-tight seal. This sealing ring consists in particular of an elastomer, thermoplastic, metal, etc. It can have a shape adapted to the shape of the plate (e.g. an O-ring) and be vulcanized to the plate.

The sealing ring can be embedded in the plate 32 (as shown here) or (in other embodiments) in the sealing surface 24.

In addition, the sealing elements 41 and 42 can be braced against each other so that no force that is applied to the adjusting unit 31 is produced. However, this minimizes any force acting against the adjustment direction during the process of spacing the plate 32 from the sealing surface 24, i.e. when the valve is opened. This is due to the fact that one of the sealing elements approaches its initial position when the valve is opened, and the other one continues to (still)

tension through the adjustment path. This reduction on the one hand and increase on the other ideally cancel each other out, but at least minimize the resulting resistance during adjustment. Consequently, (essentially) only the pretension caused by the pretensioning device (springs 91 and 92) has to be overcome when the valve is opened or closed. In particular, the sealing elements are metal membranes.

Figure 4:
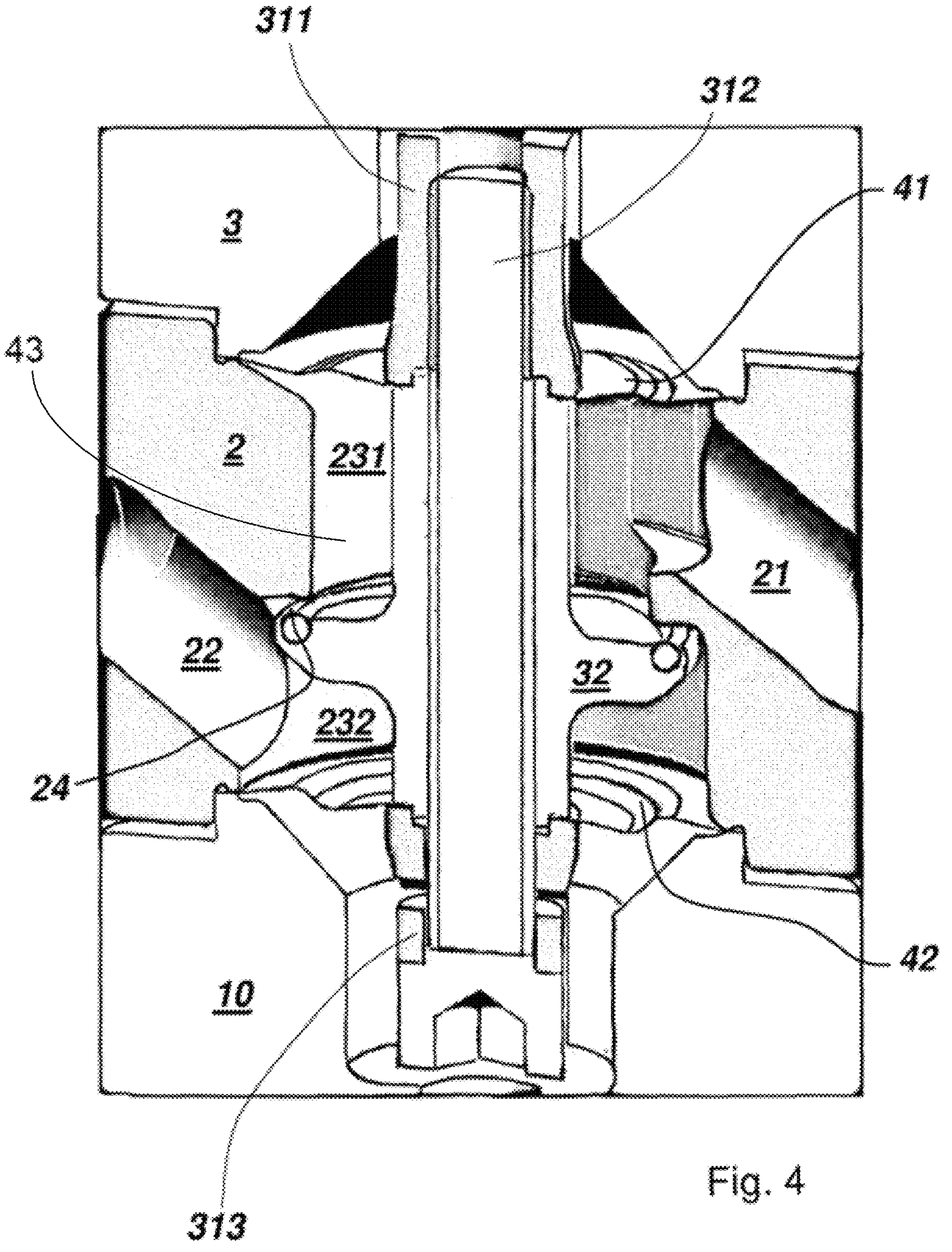
FIG. 4 shows in detail the inner volume of the gas inlet valve.

FIG. 4 shows the gas flow unit 2 in detail, in particular the plate 32 that is adjustable therein and the two flexible sealing elements 41 and 42, which are clamped between the gas flow unit 2 and the adjusting device 3, or between the gas flow unit 2 and a counter component 10 in the exemplary embodiment shown. This clamping can be achieved by a screw connection (see 101 and 102 in FIG. 3).

The seats of the flexible sealing elements 41 and 42 on the adjusting unit 31 can also be carried out by way of clamping, as shown in FIG. 4. The adjusting unit 31 comprises the rod 311, but also the screw 312, as well as the sleeve 313, and the plate 32. The screw 312 is screwed into the rod 311, wherein on the one hand the sealing element 41 is clamped between the rod 311 and the plate 32, and on the other hand the sealing element 42 is clamped between the plate 32 and the sleeve 313. The person skilled in the art knows of a multitude of other design possibilities for connecting the sealing elements to the adjusting unit, so that the plate can be adjusted in the inner volume 23.

Shown are inner volume 23, plate 32, sealing surface 24, shaft 311, sleeve 313, sealing elements 41 and 42, sealing ring 33 each with circular cross-section. In particular, the inner volume 23 is shown as a hollow cylinder. This is not necessarily the case as these components can also be elliptical, rectangular or manufactured in any profile. The sealing surface 24 is also shown here as a shoulder in the first partial volume 231, which has free access to the gas inlet 21, wherein this results in a smaller cross-section in the first partial volume. In other embodiments, the shoulder of the sealing surface 24 goes back again to the average which is also shown in the second partial volume 232, which has free access to gas outlet 22. The jacket surfaces can also have a different shape and do not have to be oriented to a hollow cylinder.

The first partial volume 231 is formed in a ring between the jacket surface 43 of the inner volume 23 and a jacket surface of the upper axial part of the plate 32, and is limited in the axial direction by the sealing element 41 and the front plate surface. The second partial volume 232 is formed annularly between the jacket surface 43 of the inner volume 23 and a jacket surface of the lower axial part of the plate 32, and is limited in the axial direction by the sealing element 42 and the rear plate surface.

The control unit 7 is especially designed to adjust the plate 32 in a defined way. The closed position (plate 32 is pressed against sealing surface 24) can be achieved either purely passively, i.e. by means of a possible pretension (pretensioning device and/or sealing elements), or by a corresponding active adjustment of the adjusting device 3, controlled by the control unit 7. An open position of the plate 32 means that the plate 32 is lifted from the sealing surface 24. The extent to which the plate 32 is lifted can be defined in this case by the adjusting device 3, which is correspondingly controlled by the control unit 7. In addition to defined target values (closed position, open position by a certain distance), the control unit 7 can also be set up to travel defined traverse paths of the plate 32. This means that in order to achieve a leisurely opening process that avoids turbulence, the plate 32 could be lifted from the sealing surface 24 at a very low starting speed and then, after a certain distance, achieve a faster lift-off speed. In other embodiments, the valve can be opened in a defined "pulsed" manner so that the process gas can be fed into the process chamber in chunks.

For the control of the adjusting unit 31 by the control unit 7, in particular the position determination unit 5 is continuously read out and used as feedback.

With such specific controls, it is also always taken into account that a relatively high pressure prevails at the gas inlet 21 of the gas flow unit 2 (due to the connected gas line or gas cylinder) and that a pressure of between 0 bar and the overpressure of the gas source can prevail at the gas outlet 22.

An advantage of the gas inlet valve according to the invention is that a gas supply can basically accumulate in the first partial volume, to which the gas inlet 21 has free access. When the gas inlet valve 1 is opened, this gas supply can be passed on to the second partial volume 232 in a fluidically favorable and abrupt manner. Measured against these fluidic advantages, the gas inlet valve according to the invention also has a very small size.

A further advantage lies in the flexible sealing elements, which are shown here as membrane 41 and 42. The pressure changes that occur when opening and closing the gas inlet valve 1 can be damped by these sealing elements, which increases the durability of the entire system.

Figure 5A:
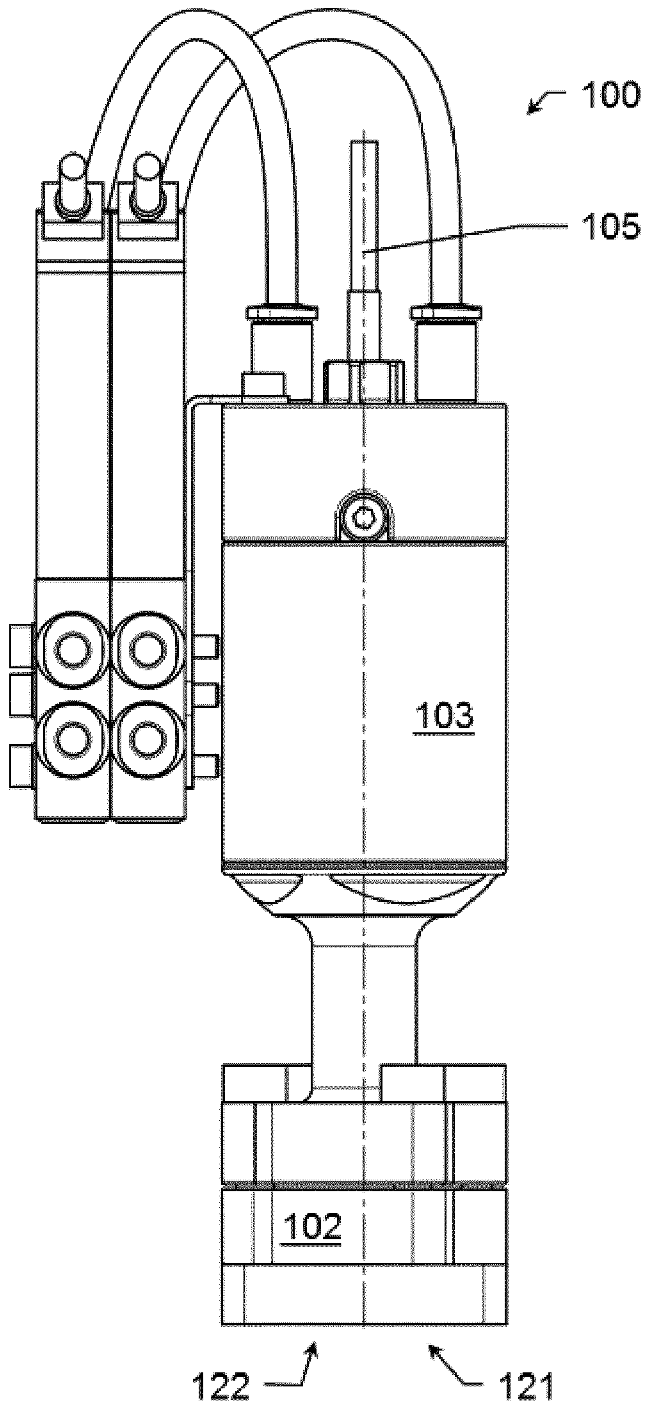
FIGS. 5*a* and 5*b* show a further embodiment of the invention.
Figure 5B:
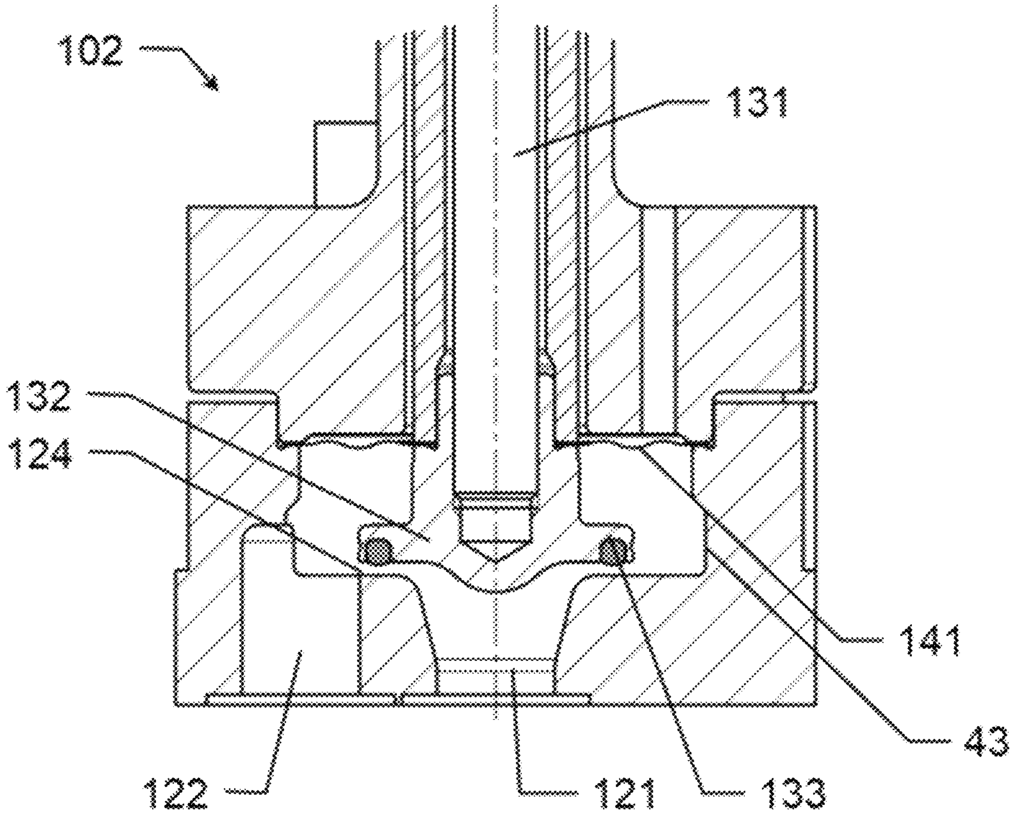

FIGS. **5*a* and 5*b* show another embodiment of the invention. FIG. 5*a* shows a gas inlet valve 100 with an adjusting device 103, a gas flow unit 102 and a position determination unit 105. This embodiment differs from the embodiments according to the preceding figures, in particular by the design of the gas flow unit 102 and the sealing by means of (only) a membrane 141**.

FIG. **5*b* shows a section through the gas flow unit 102. A valve closure or valve plate 132 is arranged in the inner volume of the valve 100 and is linearly movable by means of the rod 131 of the adjusting device 103. The valve plate 132 is fixedly connected to the rod 131. The valve 100 is shown here in an open state, i.e. a gas or a fluid can flow through the gas inlet 121 via the inner volume to and through the gas outlet 122. In this condition, the valve plate 132 is spaced from a sealing surface 124 provided inside the gas flow unit 102. In the embodiment shown, the valve plate 132 includes a sealing element 133. However, it is understood that according to alternative embodiments, the sealing element 133 may be arranged on the sealing surface 124**.

Due to the fixed and in particular rigid connection of the plate 132 with the rod 131, the position of the plate 132 can be determined directly by means of the position determination unit 105, which can determine a linear position of the rod 131 (as part of the adjusting unit). The position determination unit 105 thus enables a determination of whether the valve is closed or open, as well as a determination of how large a possible distance between the sealing surface 124 and the valve plate 132 or sealing element 133 is, i.e. how large an existing opening cross-section is and thus how large a possible volume flow through the valve 100 currently is.

The membrane 141, which is designed as a flexible sealing element, provides a flexible seal of the inner volume with respect to the adjusting unit 103. For this purpose, the membrane 141 is connected on the one hand to the gas flow unit 102 and on the other hand to the adjusting unit, in this case to the plate 132 or to the rod 131.

The figures always show a plate 32 or 132, which has an upper and lower axial part (hollow shaft sections). In other embodiments, the plate 32 or 132 can be only a disc, wherein the upper and lower parts of the plate 32 or 132 can be replaced by simple hollow shafts, which are sealed axially to the disc. Furthermore, the figures always show a plate 32 or 132 which is opened in the direction of gas flow, i.e. which is adjusted from top to bottom according to the figures. In other exemplary embodiments, however, the components involved can also be designed and arranged in such a way that the plate is pressed onto the sealing surface from above for the closed position, and is moved upwards for an open position.

Although the invention has been explained on the basis of its preferred embodiment(s), many other changes and variations can be made without going beyond the scope of the present invention. Therefore, it is provided that the enclosed claims cover changes and variations which are contained in the actual scope of the invention.

The invention claimed is:

1. A gas inlet valve for a controlled flow of a process gas into a vacuum process chamber, wherein the gas inlet valve comprises:

a gas flow unit having a gas inlet, a gas outlet, and an inner volume having free access to the gas inlet and the gas outlet, wherein the gas flow unit comprises a sealing surface in the inner volume, an adjusting device having an adjusting unit, wherein the adjusting unit projects into the inner volume and is adjustably mounted outside the gas flow unit in the adjusting device, wherein the adjusting unit has a plate which is arranged inside the inner volume, wherein the plate is movable by the adjusting device between a closed position and an open position, the closed position corresponding to the plate resting on the sealing surface and thus preventing a gas flow between the gas inlet and the gas outlet, and the open position corresponding to the plate spaced from the sealing surface and thus enabling the gas flow, a first flexible sealing element attached to the gas flow unit and to the adjusting unit, the first flexible sealing element being configured to seal a first side of the inner volume, and a position determination unit arranged on or in the adjusting device and configured to determine a position of a part of the adjusting unit which has a fixed local relation to the plate, wherein the first flexible sealing element is formed as a metal membrane, and wherein the first flexible sealing element is clamped between a rod of the adjusting unit and the plate.

2. The gas inlet valve according to claim 1, further comprising:

a second flexible sealing element attached to the gas flow unit and to the adjustment unit, the second flexible sealing element being configured to seal a second side of the inner volume.

3. The gas inlet valve according to claim 2, wherein the first flexible sealing element or the second flexible sealing element is attached to the plate and the gas flow unit.

4. The gas inlet valve according to claim 2, wherein the second flexible sealing element is formed as another metal membrane.

5. The gas inlet valve according to claim 2, wherein the first flexible sealing element and the second flexible sealing element are pretensioned against each other, so that, in case of an adjustment of the adjusting unit, no or a comparatively low resistance force is created by the first flexible sealing element and the second flexible sealing element.

6. The gas inlet valve according to claim 2, wherein the sealing surface, the plate, the first flexible sealing element, and the second flexible sealing element each have a circular cross-section, wherein the inner volume is cylindrical at least in sections, and wherein the sealing surface is formed by a shoulder in the inner volume.

7. The gas inlet valve according to claim 6, wherein a cylindrical shape of the inner volume includes a jacket surface based on the gas flow unit and base surfaces based on the first flexible sealing element and the second flexible sealing element, wherein the gas inlet and the gas outlet have free access to the inner volume via the jacket surface.

8. The gas inlet valve according to claim 1, wherein the plate is pressed against the sealing surface in the closed position by a pretension, wherein the pretension is at least partly provided by at least the first flexible sealing element and/or at least partly by a pretensioning device arranged outside the inner volume.

9. The gas inlet valve according to claim 1, wherein the plate and/or the sealing surface has a sealing ring which is compressed in the closed position.

10. The gas inlet valve according to claim 1, wherein the adjusting device is operated electrically or pneumatically.

11. The gas inlet valve according to claim 1, wherein the plate in the closed position divides the inner volume into a first partial inner volume and a second partial inner volume, and wherein the gas inlet has free access to the first partial inner volume, and the gas outlet has free access to the second partial inner volume.

12. The gas inlet valve according to claim 1, wherein the gas outlet has free access to the vacuum process chamber, and wherein the gas inlet has free access to a gas source.

13. The gas inlet valve according to claim 1, further comprising:

a second flexible sealing element attached to the gas flow unit and to the adjustment unit, the second flexible sealing element being configured to seal a second side of the inner volume, wherein the first flexible sealing element and the second flexible sealing element are pretensioned against each other, so that no force or a comparatively low force that is applied to the adjusting unit is created by the first flexible sealing element and the second flexible sealing element.

* * * * *